United States Patent
Koganti et al.

(10) Patent No.: US 10,886,921 B1
(45) Date of Patent: Jan. 5, 2021

(54) MULTI-CHIP STACKED DEVICES

(71) Applicant: XILINX, INC., San Jose, CA (US)

(72) Inventors: Vijay Kumar Koganti, Hyderabad (IN); Anil Kumar Kandala, Hyderabad (IN); Santosh Yachareni, Hyderabad (IN)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/825,340

(22) Filed: Mar. 20, 2020

(51) Int. Cl.
*G06F 7/38* (2006.01)
*H03K 19/177* (2020.01)
*H03K 19/173* (2006.01)
*H01L 25/065* (2006.01)
*H01L 23/00* (2006.01)
*H01L 25/00* (2006.01)
*H03K 19/20* (2006.01)

(52) U.S. Cl.
CPC ......... *H03K 19/1733* (2013.01); *H01L 24/08* (2013.01); *H01L 24/80* (2013.01); *H01L 25/0657* (2013.01); *H01L 25/50* (2013.01); *H03K 19/20* (2013.01); *H01L 2224/08145* (2013.01); *H01L 2224/80895* (2013.01); *H01L 2224/80896* (2013.01); *H01L 2225/06524* (2013.01); *H01L 2924/1431* (2013.01)

(58) Field of Classification Search
None
See application file for complete search history.

(56) References Cited

U.S. PATENT DOCUMENTS

| | | | | |
|---|---|---|---|---|
| 2013/0162343 A1* | 6/2013 | Byeon | ................. | H01L 25/0657 327/564 |
| 2013/0329481 A1* | 12/2013 | Yokou | ..................... | G11C 5/06 365/63 |
| 2014/0062587 A1 | 3/2014 | Koyanagi | | |
| 2019/0088296 A1* | 3/2019 | Morohashi | ............... | G11C 7/24 |

* cited by examiner

*Primary Examiner* — Anh Q Tran
(74) *Attorney, Agent, or Firm* — Patterson + Sheridan, LLP

(57) ABSTRACT

Examples described herein generally relate to multi-chip devices having stacked chips. In an example, a multi-chip device includes a chip stack including a base chip and two or more overlying chips overlying the base chip. Neighboring chips of the chip stack are connected to each other. The chip stack includes identification generation connections and circuits configured to generate a unique identification of each overlying chip based on a relative position of the respective overlying chip with reference to the base chip. The chip stack includes a communication channel from the base chip to each overlying chip. Each overlying chip includes comparison and enable/disable logic (CEDL) communicatively coupled to the communication channel. The CEDL is configured to compare a target identification of data received by the respective overlying chip to the unique identification of the respective overlying chip and responsively enable or disable a recipient circuit of the respective overlying chip.

20 Claims, 4 Drawing Sheets

MULTI-CHIP STACKED DEVICES

TECHNICAL FIELD

Examples of the present disclosure generally relate to multi-chip stacked devices containing stacked chips.

BACKGROUND

Apparatuses, including modules and/or packages, that include multiple integrated circuit chips have been developed. The forms of such apparatuses are varied. By forming such apparatuses, an electronic device can integrate multiple chips to form the device, where each chip can be manufactured using standard semiconductor processing to then be assembled and packaged to form a larger, multi-functional device. By having different chips, in some instances, semiconductor processing that is difficult to integrate can be separated, such as when parts of one chip require a different process from another chip.

Another aspect is an ability to build a device having chips with different functionalities (for example, some are field programmable gate array (FPGA) chips and some are memory chips) into a same apparatus with a smaller device size and more functionality and lower power. Semiconductor processes for a chip can be more focused to give devices a greater edge in areas such as increased performance of the chip, reduced costs, and increased yield in manufacturing. Other benefits can be realized by such apparatuses.

SUMMARY

Examples described herein generally relate to multi-chip devices having vertically stacked chips. More specifically, some examples described herein relate to unique identifications (IDs) of at least some of the chips of the chip stack that are generated as a result of the positioning of the respective chips in the chip stack.

An example described herein is a multi-chip device. The multi-chip device includes a chip stack. The chip stack includes a base chip and two or more overlying chips overlying the base chip. Neighboring chips of the chip stack are connected to each other. The chip stack includes identification generation connections and circuits configured to generate a unique identification of each chip of the two or more overlying chips based on a relative position of the respective overlying chip with reference to the base chip. The chip stack includes a communication channel from the base chip to each chip of the two or more overlying chips. Each chip of the two or more overlying chips includes comparison and enable/disable logic (CEDL) communicatively coupled to the communication channel. The CEDL is configured to compare a target identification of data received by the respective overlying chip to the unique identification of the respective overlying chip and responsively enable or disable a recipient circuit of the respective overlying chip.

Another example described herein is a method of operating a multi-chip device. A unique identification of each chip of two or more overlying chips of a chip stack are generated, by identification generation connections and circuits of the chip stack, based on a relative position of the respective overlying chip with reference to a base chip of the chip stack. The two or more overlying chips overlying the base chip in the chip stack. Neighboring chips of the chip stack being connected to each other. Data is communicated between the base chip and each chip of the two or more overlying chips via a communication channel. At each chip of the two or more overlying chips, a target identification of the data received by the respective overlying chip is compared to the unique identification of the respective overlying chip. The comparison is by CEDL of the respective overlying chip. The CEDL is communicatively coupled to the communication channel. At each chip of the two or more overlying chips, a recipient circuit of the respective overlying chip is enabled or disabled in response to comparing the target identification to the unique identification of the respective overlying chip.

Another example described herein is a multi-chip device. The multi-chip device includes a chip stack. The chip stack includes a base chip and fabric chips overlying the base chip. Neighboring chips of the chip stack are connected to each other. Each chip of the fabric chips includes increment logic, configuration logic, and a programmable logic region. The increment logic of one of the fabric chips immediately overlying the base chip has input nodes connected to a ground node of the base chip. The increment logic of each subsequently overlying one of the fabric chips has input nodes connected to output nodes of the increment logic of an immediately underlying one of the fabric chips. For each chip of the fabric chips, the input nodes of the increment logic of the respective fabric chip is connected to respective input nodes of the configuration logic of the respective fabric chip. The configuration logic is configured to receive a unique identification on the input nodes of the configuration logic. The chip stack includes a communication channel from the base chip to each chip of the fabric chips. For each chip of the fabric chips, the configuration logic is configured to compare a target identification of configuration data received by the configuration logic from the communication channel to the unique identification received by the configuration logic, to program a programmable tile of the programmable logic region based on address data and state data of the configuration data when the target identification matches the unique identification, and to not program any programmable element when the target identification does not match the unique identification.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
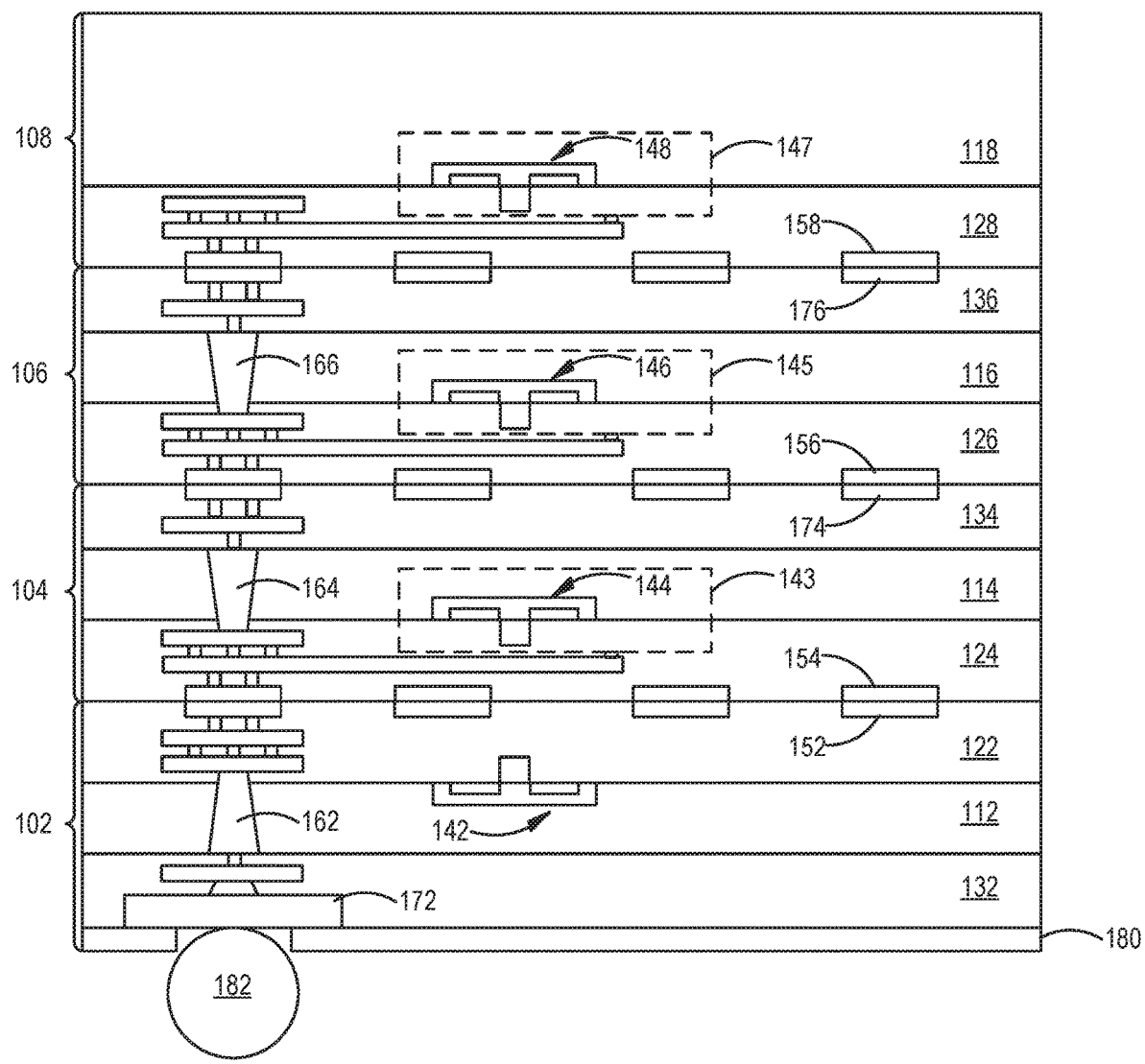
FIG. 1 is a structure of a multi-chip device according to some examples.

Examples described herein generally relate to multi-chip devices having vertically stacked chips. More specifically, some examples described herein relate to unique identifications (IDs) of at least some of the chips of the chip stack that are generated as a result of the positioning of the respective chips in the chip stack. At least some of the chips of the chip stack can have a same hardware layout and have different unique IDs. The stacking of the chips and the connections between the chips naturally result in unique IDs being generated for each of those chips. The same hardware layout of those chips can permit a single tape-out of the chips, which reduces costs. Additionally, a number of different size products can be implemented with using any number of a same chip type with the same hardware layout. The generation of the unique IDs as described herein can be based on non-volatile connectivity, and can obviate using eFuses or other non-volatile memory to store unique IDs and using other programming mechanisms to program unique IDs.

Generally, the chip stack can include ID generation connections and circuits that are configured to generate a unique ID for chips overlying a base chip. The unique IDs are based on a relative position of the respective chip with reference to the base chip. In some examples, chips overlying the base chip each include increment logic, such as an adder, a look-up table, a state machine, arithmetic logic, other combinational or sequential logic, the like, or a combination thereof. The increment logic of the chips can be serially connected such that input nodes of increment logic of a chip are connected to output nodes of increment logic of an immediately underlying chip. Input nodes of increment logic of a chip immediately overlying a base chip can be connected to a node, such as a ground node, of the base chip. In some examples, a unique ID for a chip can be generated at the input nodes or the output nodes of the increment logic of that chip.

The chips overlying the base chip can further include comparison and enable/disable logic (CEDL), which, in some examples, is part of configuration logic. The chip stack also can include a communication channel from the base chip to the overlying chips. The CEDLs of the chips can be communicatively coupled to the communication channel. The CEDLs are configured to receive the respective unique IDs. The CEDLs are further configured to receive data from the communication channel, where the data includes a target ID of a target chip. Each CEDL is configured to compare to unique ID of the respective chip to the target ID of the data. If the unique ID and the target ID match, the CEDL may enable a subsequent circuit of the chip to receive and/or operate on another portion(s) of the received data. If the unique ID and the target ID do not match, the CEDL may disable a subsequent circuit of the chip from receiving and/or operating on another portion of the received data. In this way, communications from a base chip can target one chip of the chip stack, where the chips overlying the base chip can receive the communications while one is enabled due to the CEDL of that chip and others are disabled due to respective CEDLs of those chips.

Stacking chips, e.g., in a three-dimensional integrated circuit (3DIC) can create multiple and larger end products with different combinations of chips. This can reduce the number of tape-outs required and can reduce product development costs if chips with a same hardware layout are implemented in the chip stack. Larger products of, e.g., Field Gate Programmable Arrays (FPGAs), System-on-Chips (SoCs), processors, and/or Application Specific Integrated Circuits (ASICs) can be created with fewer (e.g., one) tape-outs by stacking chips having a same hardware layout. Cost savings can be leveraged when chips used in a chip stack have a same hardware layout, since, for example, research and development can be reduced for fewer tape-outs.

A challenge in stacking chips with multiple chips having a same hardware layout is communicating signals between chips. Since every chip that has a same hardware layout receives or transmits the signal at the same physical location within the respective chip, the signal can also be received at each chip that has a same hardware layout. Various previous solutions addressed this by programming active circuitry to control communicating the signals between different active circuits. These previous solutions, however, had challenges in that, for example, the programmability could create reliability issues and/or the control might not be able to be programmed prior to power up, which could preclude communicating some signals during a power up sequence. As noted above, examples herein can obviate these challenges.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described. Further, methods described herein may be described in a particular order of operations, but other methods according to other examples may be implemented in various other orders (e.g., including different serial or parallel performance of various operations) with more or fewer operations.

FIG. 1 is a structure of a multi-chip device according to some examples. The multi-chip device of FIG. 1 includes a chip stack that includes a base chip 102 and fabric chips 104, 106, 108. The base chip 102 and fabric chips 104-108 are described herein as examples. Although the different chips are described herein as being or including various integrated circuits (ICs) or components (e.g., fabric, base, programmable logic, etc.), aspects described herein can be generally applicable to chips of a multi-chip device having any type of IC or component.

In the multi-chip device of FIG. 1, the fabric chips 104-108 are arranged active or front side facing down towards the base chip 102, where the base chip 102 is arranged active or front side facing up towards the fabric chips 104-108. In other multi-chip devices, intermediate fabric chips are arranged active or front side facing up away from the base chip 102, and a distal fabric chip is arranged active or front side facing down towards the base chip 102, where the base chip 102 is arranged active or front side facing up towards the fabric chips 104-108. Various other multi-chip devices can have different structures, different number of chips, additional components, etc.

Generally, the chips 102-108 are stacked and form a chip stack in the multi-chip device. The chips 102-108 are stacked to form, in some examples, an Active die-on-Active die (AoA) device. Each of the chips 102-108 can include an active IC. In some examples, more or fewer chips can be included in the chip stack. For example, a multi-chip device can have two chips, such as a base chip and a fabric chip, or two fabric chips. In other examples, a multi-chip device can have three chips, four chips, five chips, etc.

Each of the chips 102-108 includes a respective semiconductor substrate 112, 114, 116, 118 and respective front side dielectric layer(s) 122, 124, 126, 128 on a front side of the respective semiconductor substrate 112-118. The front side dielectric layer(s) 122-128 include metallization (e.g., metal lines and/or vias) (illustrated but not specifically numbered) formed therein which can electrically connect various components in an IC. Each of the chips 102-106 includes respective backside dielectric layer(s) 132, 134, 136 on a backside of the respective semiconductor substrate 112-116. The backside dielectric layer(s) 132-136 include metallization (e.g., metal lines and/or vias) (illustrated but not specifically numbered) formed therein which can electrically connect various components in an IC. As illustrated, metallization in front side dielectric layer(s) 124, 126, 128 of the fabric chips 104, 106, 108 connect to respective circuit regions 143, 145, 147 of the fabric chips 104, 106, 108 in which respective active circuits can be formed. Such connections and example active circuits will be described in further detail below in the context of subsequent figures.

Each semiconductor substrate 112-118 of the chips 102-108 includes, e.g., a transistor 142, 144, 146, 148 formed on and/or in the front side surface of the respective semiconductor substrate 112-118. The transistor 144, 146, 148 and any other components can be connected to the metallization in the front side dielectric layer(s) 122-128. The transistor 144, 146, 148 is illustrated in the respective circuit region 143, 145, 147 of the fabric chip 104, 106, 108; however, the transistor 144, 146, 148 and/or other transistors can be outside of the circuit region 143, 145, 147. Each semiconductor substrate 112-116 of the respective chip 102-106 has backside through-substrate via(s) (TSV(s)) 162, 164, 166 therethrough, which can electrically connect the metallization in the front side dielectric layer(s) 122-126 to the metallization in the backside dielectric layer(s) 132-136 of the respective chip 102-106.

Front side bond pads 152, 154, 156, 158 (e.g., metal (e.g., Cu) bond pads) are formed in the respective front side dielectric layer(s) 122-128 of the chips 102-108 at an exterior surface distal from the respective semiconductor substrate 112-118. The front side bond pads 152-158 can be in an arrangement that forms a respective chip-to-chip interface. The front side bond pads 152-158 are connected to the metallization in the respective front side dielectric layer(s) 122-128. Backside bond pads 174, 176 (e.g., metal (e.g., Cu) bond pads) are formed in the respective backside dielectric layer(s) 134, 136 of the fabric chips 104, 106 at an exterior surface distal from the respective semiconductor substrate 114, 116. The backside bond pads 174, 176 can be in an arrangement that forms a respective chip-to-chip interface. The backside bond pads 174, 176 are connected to the metallization in the respective backside dielectric layer(s) 134, 136.

Exterior connector backside pads 172 (e.g., metal (e.g., aluminum) pads) are formed in the backside dielectric layer(s) 132 of the base chip 102 at an exterior surface distal from the semiconductor substrate 112 of the base chip 102. The exterior connector backside pads 172 are connected to the metallization in the backside dielectric layer(s) 132 of the base chip 102. A passivation layer 180 is formed on the exterior surface distal from the semiconductor substrate 112 of the base chip 102 with respective openings therethrough exposing the exterior connector backside pads 172. External connectors 182 (e.g., controlled collapse chip connections (C4), minibumps, etc.) are formed on respective exterior connector backside pads 172 through the openings in the passivation layer 180.

The external connectors 182 can be attached to a package substrate. The package substrate may further be attached to, e.g., a printed circuit board (PCB) to attach the package substrate (and hence, the multi-chip device) to the PCB. Various other components can be included in a multi-chip device. For example, an interposer, an encapsulant (such as a molding compound (MUF) or the like), etc. can be included in the multi-chip device. A person having ordinary skill in the art will readily envision various modifications that can be made to the multi-chip device.

The chips 102-108 are bonded (e.g., by hybrid bonding using metal-to-metal and oxide-to-oxide bonding) together to form a chip stack. The base chip 102 is bonded to the fabric chip 104 front side to front side such that the front side bond pads 152 and exterior surface of the front side dielectric layer(s) 122 of the base chip 102 are bonded to the front side bond pads 154 and exterior surface of the front side dielectric layer(s) 124 of the fabric chip 104. The fabric chip 104 is bonded to the fabric chip 106 backside to front side such that the backside bond pads 174 and exterior surface of the backside dielectric layer(s) 134 of the fabric chip 104 are bonded to the front side bond pads 156 and exterior surface of the front side dielectric layer(s) 126 of the fabric chip 106. The fabric chip 106 is bonded to the fabric chip 108 backside to front side such that the backside bond pads 176 and exterior surface of the backside dielectric layer(s) 136 of the fabric chip 106 are bonded to the front side bond pads 158 and exterior surface of the front side dielectric layer(s) 128 of the fabric chip 108.

Other arrangements of bonding can be implemented. For example, the base chip 102 can be bonded to the fabric chip 104 front side to backside such that the front side bond pads 152 and exterior surface of the front side dielectric layer(s) 122 of the base chip 102 are bonded to the backside bond pads 174 and exterior surface of the backside dielectric layer(s) 134 of the fabric chip 104. The fabric chip 104 can be bonded to the fabric chip 106 front side to backside such that the front side bond pads 154 and exterior surface of the front side dielectric layer(s) 124 of the fabric chip 104 are bonded to the backside bond pads 176 and exterior surface of the backside dielectric layer(s) 136 of the fabric chip 106. The fabric chip 106 can be bonded to the fabric chip 108 front side to front side such that the front side bond pads 156 and exterior surface of the front side dielectric layer(s) 126 of the fabric chip 106 are bonded to the front side bond pads 158 and exterior surface of the front side dielectric layer(s) 128 of the fabric chip 108.

In other examples, the chips 102-108 can be attached together using external connectors (such as minibumps, solder, etc.). In some examples, some of the chips 102-108 can be attached together by external connectors while others of the chips can be bonded together without use of external connectors. Any permutation of bonding and use of external connectors can be implemented.

In some examples, each of the fabric chips 104-108 includes a fabric IC, which may further be processing IC. A processing IC can generally include any circuit configured to or configurable to process any data and/or signal and output data and/or a signal resulting from that processing, and is more than merely memory and any circuit ancillary to memory (e.g., address decoder, memory controller, etc.). The fabric IC of the fabric chips 104-108 is generally a same IC. More generally, the chips 104-108 can be or include any processing IC. The hardware topology, architecture, and layout of the fabric chips 104-108 are the same in some examples, except that the distal fabric chip 108 may omit components formed by backside processing, such as backside TSVs, backside dielectric layer(s), and/or metallization in backside dielectric layer(s). In some examples, the fabric ICs (e.g., processing IC) of the fabric chips 104-108 includes one or more programmable logic regions (e.g., fabric of a FPGA), which has the same hardware topology, architecture, and layout between the fabric chips 104-108.

In other examples, the chips 102-108 can each be or include a different IC or can have any permutation of including a same IC and/or different ICs. For example, any of the fabric chips 104-108 can be or include a processing IC or memory. In some examples, the chip 108 is an ASIC. Any chip 102-108 may generically be referred to as an active chip.

Figure 2:
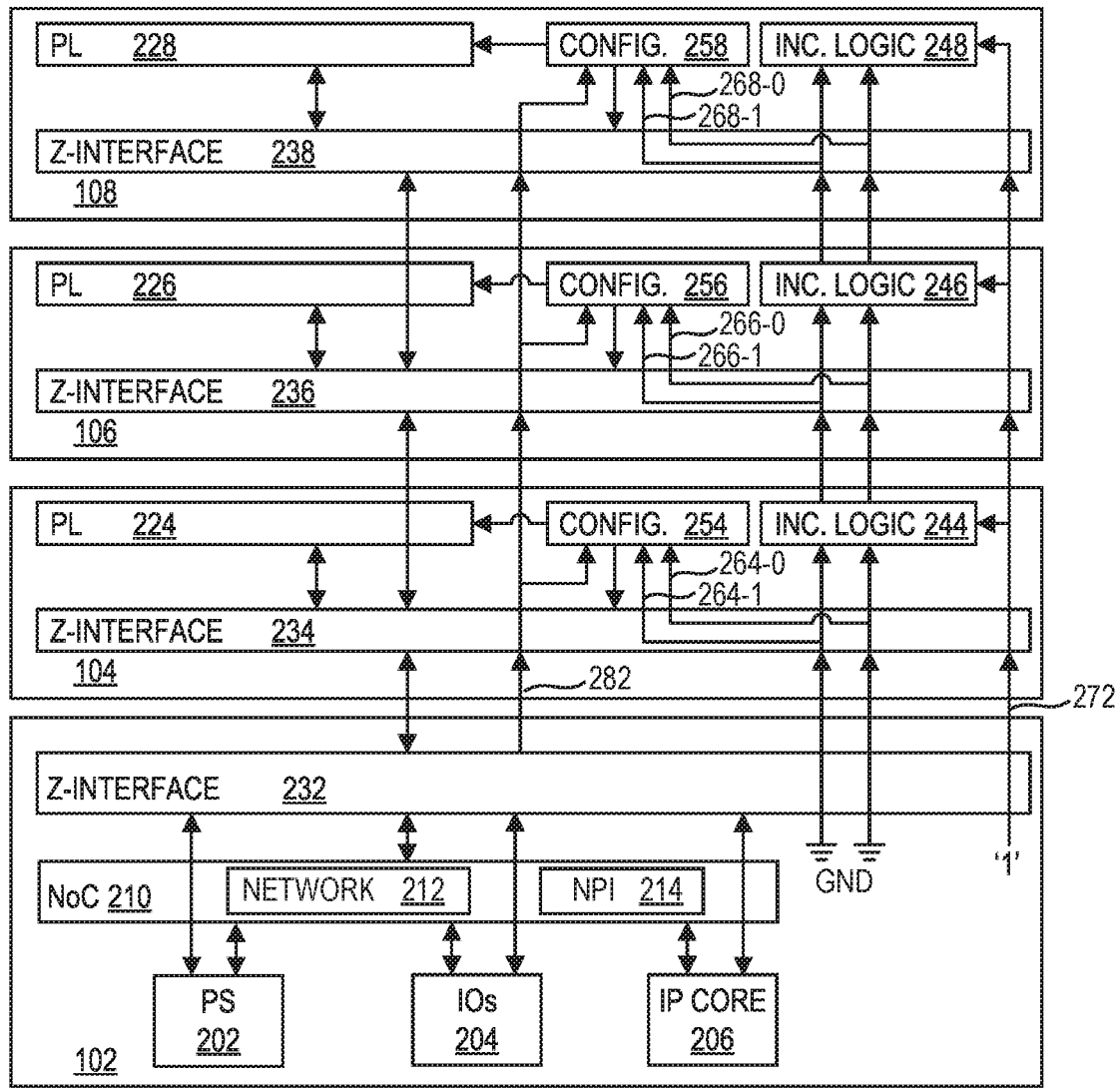
FIG. 2 is a block diagram of a circuit schematic depicting integrated circuits of a chip stack of the multi-chip device of FIG. 1 according to some examples.

FIG. 2 is a block diagram of a circuit schematic depicting ICs of a chip stack of the multi-chip device of FIG. 1 according to some examples. In the illustrated example, the multi-chip device is a multi-chip programmable device. The circuit schematic can be implemented in the multi-chip device of FIG. 1, e.g., regardless of the orientation of the fabric chips 104, 106.

In the illustrated example, the base chip 102 includes a base IC on the base chip 102, which may be a SoC. The fabric chips 104, 106, 108 include a respective fabric IC. The respective fabric ICs of the fabric chips 104, 106, 108 in some examples, are a same IC and have a same hardware layout and topology. More broadly, the fabric chips 104-108 have a same hardware layout in some examples. These ICs are provided as an example implementation. Other circuits (e.g., with other hard IP blocks) can be implemented in the chips.

The base IC on the base chip 102 includes a processing system 202, input/output circuits (IOs) 204, IP core circuits 206, a Network-on-Chip (NoC) 210, and a Z-interface 232. The processing system 202 may be or include any of a variety of different processor types and number of processor cores. For example, the processing system 202 may be implemented as an individual processor, e.g., a single core capable of executing program instruction code. In another example, the processing system 202 may be implemented as a multi-core processor. The processing system 202 may be implemented using any of a variety of different types of architectures. Example architectures that may be used to implement the processing system 202 may include an ARM processor architecture, an x86 processor architecture, a graphics processing unit (GPU) architecture, a mobile processor architecture, a reduced instruction set computer (RISC) architecture (e.g., RISC-V), or other suitable architecture that is capable of executing computer-readable program instruction code.

The input/output circuits 204 can include eXtreme Performance Input/Output (XPIO), multi-gigabit transceivers (MGTs), high bandwidth memory (HBM) interfaces, Analog-to-Digital Converters (ADC), Digital-to-Analog Converters (DAC), or any other input/output blocks. The input/output circuits 204 can be configured to receive and/or transmit signals from and/or to a circuit outside of the multi-chip device. The IP core circuits 206 can include memory controllers (such as double data rate (DDR) memory controllers, high bandwidth memory (HBM) memory controllers, or the like), peripheral component interconnect express (PCIe) interfaces, cache coherent interconnect for accelerators (CCIX) interfaces, Ethernet cores (such as a media address controller (MAC) or the like), forward error correction (FEC) blocks, and/or any other hardened circuit. Any of the input/output circuits 204 and/or IP core circuits 206 can be programmable.

The NoC 210 includes a programmable network 212 and a NoC peripheral interconnect (NPI) 214. The programmable network 212 communicatively couples subsystems and any other circuits of the base IC on the base chip 102 together. The programmable network 212 includes NoC packet switches and interconnect lines connecting the NoC packet switches. Each NoC packet switch performs switching of NoC packets in the programmable network 212. The programmable network 212 has interface circuits at the edges of the programmable network 212. The interface circuits include NoC master units (NMUs) and NoC slave units (NSUs). Each NMU is an ingress circuit that connects a master circuit to the programmable network 212, and each NSU is an egress circuit that connects the programmable network 212 to a slave endpoint circuit. NMUs are communicatively coupled to NSUs via the NoC packet switches and interconnect lines of the programmable network 212. The NoC packet switches are connected to each other and to the NMUs and NSUs through the interconnect lines to implement a plurality of physical channels in the programmable network 212. The NoC packet switches, NMUs, and NSUs include register blocks that determine the operation of the respective NoC packet switch, NMU, or NSU.

The NPI 214 includes circuitry to write to register blocks that determine the functionality of the NMUs, NSUs, and NoC packet switches. The NPI 214 includes a peripheral interconnect coupled to the register blocks for programming thereof to set functionality. The register blocks in the NMUs, NSUs, and NoC packet switches of the programmable network 212 support interrupts, quality of service (QoS), error handling and reporting, transaction control, power management, and address mapping control. The NPI 214 can include an NPI root node residing on the processing system 202 (e.g., a platform management controller (PMC) of the processing system 202), interconnected NPI switches connected to the NPI root node, and protocol blocks connected to the interconnected NPI switches and a corresponding register block. The NPI 214 may be used to program any programmable circuit of the base IC on the base chip 102. For example, the NPI 214 may be used to program any input/output circuit 204 and/or IP core circuit 206 that is programmable.

The Z-interface 232 can include passive connections between the base IC and a fabric IC of an overlying chip and/or passive connections between a component exterior to the chip stack and a fabric IC of an overlying chip (e.g., a pass-through interface). The Z-interface 232 can include active circuits, such as buffers to drive signals. The Z-interface 232 provides an interface, including through metal lines/pads and vias in front side and backside metallization layers and through TSVs, for the processing system 202, input/output circuits 204, IP core circuits 206, and programmable network 212 of the NoC 210 to fabric ICs of fabric chips 104-108 overlying the base chip 102 and/or to a substrate (e.g., package substrate) underlying the base chip 102. Additionally, in some examples, the Z-interface 232 can include programmable active circuits that are configured to provide selective connections between the base chip 102 and overlying chips.

The various subsystems and circuits of the base IC on the base chip 102 can be communicatively coupled. As illustrated, the processing system 202, input/output circuits 204, and IP core circuits 206 are connected to the NoC 210 (e.g., to the programmable network 212), and hence, are communicatively coupled to each other. The processing system 202 is further connected to the NPI 214 for communicating configuration data to various programmable components on the base chip 102. The processing system 202 is further connected to the programmable network 212 of the NoC 210 for communicating configuration data to chips overlying the base chip 102. The programmable network 212 of the NoC 210 is connected to the Z-interface 232 such that data, such as transactional data and configuration data, can be communicated through the Z-interface 232 to another chip. Each of the processing system 202, input/output circuits 204, and IP core circuits 206 is connected to the Z-interface 232 for communications with, e.g., programmable logic in the fabric ICs in overlying fabric chips 104, 106, 108. Other communication mechanisms, such as direct connections, between the various subsystems and circuits may be implemented.

The fabric IC on each of the fabric chips 104-108 includes one or more programmable logic (PL) region 224, 226, 228. The PL region 224, 226, 228 is logic circuitry that may be programmed to perform specified functions. The PL region 224, 226, 228 can include any number or arrangement of programmable tiles. As an example, the PL region 224, 226, 228 may be implemented as fabric of an FPGA. For example, the PL region 224, 226, 228 can include any number of configurable logic blocks (CLBs), look-up tables (LUTs), digital signal processing blocks (DSPs), random access memory blocks (BRAMs), etc. Each of the programmable tiles (e.g., CLBs, LUTs, DSPs, BRAMs, etc.) can include one or more programmable interconnect elements. The various respective types of programmable tiles can be arranged in rows and/or columns, and the associate programmable interconnect elements can be connected to neighboring programmable logic elements in a same column and row, for example. The programmable interconnect element can form an interconnect network of the PL region 224, 226, 228. Any logic and connections can be implemented by the PL region 224, 226, 228 by programming any of the programmable tiles of the PL region 224, 226, 228.

The fabric IC on each of the fabric chips 104-108 also includes a Z-interface 234, 236, 238. The Z-interface 234, 236, 238 can include passive connections between an IC of an underlying chip and a fabric IC of an overlying chip (e.g., a pass-through interface), passive connections from an IC of an underlying chip to the fabric IC of the respective chip, and/or passive connections from a fabric IC of an overlying chip to the fabric IC of the respective chip. The Z-interface 234, 236, 238 can include active circuits, such as buffers to drive signals and/or programmable active circuits. In some examples, the Z-interface 234, 236, 238 can include programmable active circuits that are configured to provide selective connections between the respective fabric IC of the respective fabric chip 104-108 and an IC of an underlying and/or overlying chip, and/or pass-through connections between respective ICs of an underlying chip and an overlying chip. The Z-interface 234-238 provides an interface, including through metal lines and vias in front side and backside metallization layers and through TSVs, for the respective fabric IC to communicate with ICs of chips overlying and/or underlying the respective fabric chip 104-108 and/or through which an IC of an underlying chip can communicate with an IC of an overlying chip (e.g., through a pass-through interface). Configuration data for the PL regions 224, 226, 228 can be transmitted through passive connections (e.g., a pass-through interface) through Z-interfaces 234, 236, 238, for example.

The fabric IC on each of the fabric chips 104-108 also includes increment logic 244, 246, 248 and configuration logic 254, 256, 258. Generally, and as will become apparent, the base IC on the base chip 102 and the increment logics 244-248 are connected in a way to provide a unique ID to each fabric chip 104-108. The unique IDs of the fabric chips 104-108 are generated as a result of the positioning of the respective fabric chips 104-108 in the chip stack. The stacking of the fabric chips 104-108 and the connections between the chips 102-108 naturally result in unique IDs being generated for each of the fabric chips 104-108. The unique ID is used by corresponding configuration logic 254-258 to determine whether data, such as configuration data, targets the PL region 224-228 (or in some instances, programmable active circuits of the Z-interface 234-238) of the respective fabric chip 104-108.

The configuration logic 254 of the fabric IC of the fabric chip 104 has a first ID bit input node connected to a first ID node 264-0 and has a second ID bit input node connected to a second ID node 264-1. The increment logic 244 of the fabric IC of the fabric chip 104 has a first bit input node connected to the first ID node 264-0 and has a second bit input node connected to the second ID node 264-1. The ID nodes 264-0, 264-1 are connected to a ground node (GND) on the base chip 102. The ID nodes 264-0, 264-1, which are also ground nodes as connected, can be connected through and/or include passive connections of the Z-interfaces 234, 232 of the fabric chip 104 and base chip 102, respectively.

The increment logic 244 can be or include any logic to increment a logical value on the ID nodes 264-0, 264-1 and output the incremented logical value on respective output nodes that are connected to a first ID node 266-0 and a second ID node 266-1. The increment logic 244 can be or include any combinational logic, sequential logic, arithmetic logic, the like, or a combination thereof. In some examples, the increment logic 244 is or includes an adder. In some examples, the increment logic 244 is or includes a state machine. In some examples, the increment logic 244 is or includes a look-up table (LUT).

The configuration logic 256 of the fabric IC of the fabric chip 106 has a first ID bit input node connected to the first ID node 266-0 and has a second ID bit input node connected to the second ID node 266-1. The increment logic 246 of the fabric IC of the fabric chip 106 has a first bit input node connected to the first ID node 266-0 and has a second bit input node connected to the second ID node 266-1. As described above, the ID nodes 266-0, 266-1 are connect to respective output nodes of the increment logic 244 of the fabric IC of the fabric chip 104. The ID nodes 266-0, 266-1 can be connected through and/or include passive connections of the Z-interfaces 236, 234 of the fabric chips 106, 104, respectively. Like the increment logic 244, the increment logic 246 can be or include any logic to increment a logical value on the ID nodes 266-0, 266-1 and output the incremented logical value on respective output nodes that are connected to a first ID node 268-0 and a second ID node 268-1. The increment logic 246 can be or include any combinational logic, sequential logic, arithmetic logic, the like, or a combination thereof, like the increment logic 244.

The configuration logic 258 of the fabric IC of the fabric chip 108 has a first ID bit input node connected to the first ID node 268-0 and has a second ID bit input node connected to the second ID node 268-1. The increment logic 248 of the fabric IC of the fabric chip 108 has a first bit input node connected to the first ID node 268-0 and has a second bit input node connected to the second ID node 268-1. As described above, the ID nodes 268-0, 268-1 are connect to respective output nodes of the increment logic 246 of the fabric IC of the fabric chip 106. The ID nodes 268-0, 268-1 can be connected through and/or include passive connections of the Z-interfaces 238, 236 of the fabric chips 108, 106, respectively. Like the increment logic 244, the increment logic 248 can be or include any logic to increment a logical value on the ID nodes 268-0, 268-1 and output the incremented logical value on respective output nodes, although the output nodes may not be further connected to other circuits. The increment logic 248 can be or include any combinational logic, sequential logic, arithmetic logic, the like, or a combination thereof, like the increment logic 244.

In the illustrated example of FIG. 2, the increment logic 244, 246, 248 are respective adders, although as indicated, the increment logic 244, 246, 248 can be or include other circuits. The increment logic 244, 246, 248 further has another input node connected to a logical "1" node 272 (e.g., a power supply node). The logical "1" node 272 can be connected through and/or include passive connections of the Z-interfaces 232-238 of the chips 102-108. In other examples, each fabric IC can have a local logical "1" node that is connected to the input of the respective increment logic 244, 246, 248.

Upon the chip stack being powered up, the logical "1" node 272 is brought to a high voltage (e.g., a logical "1") by the base IC of the base chip 102, and the ground node (GND) is brought to ground voltage (e.g., a logical "0") by the base IC of the base chip 102. The increment logic 244, 246, 248 (e.g., adder), upon the chip stack being powered up, adds the logical "1" from the logical "1" node 272 to a value received on input nodes connected to the respective pair of ID nodes 264, 266, 268, and outputs the incremented values on output nodes that may be connected to another respective pair of ID nodes 266, 268. The value output by increment logic 244, 246 on a respective pair of ID nodes 266, 268 is a unique ID of the immediately overlying fabric chip 106, 108. Similarly, the value provided by the base IC of the base chip 102 by connecting the pair of ID nodes 264 to the ground node (GND) is a unique ID of the immediately overlying fabric chip 104. Hence, upon being powered up, the unique ID on the ID nodes 264 and received by the configuration logic 254 is "00"; the unique ID on the ID nodes 266 and received by the configuration logic 256 is "01"; and the unique ID on the ID nodes 268 and received by the configuration logic 258 is "10". Unique IDs can be provided on ID nodes 264, 266, 268 and received by configuration logic 254, 256, 258, respectively. This may be accomplished using an adder with the logical "1" node 272 or similar local nodes, and/or may be accomplished without such logical "1" node(s) using other logic as the increment logic 244, 246, 248.

Modifications to various connections between the increment logic 244-248 and configuration logic 254-258 can be made. For example, ID nodes 266 (e.g., output nodes of the increment logic 244) can be connected to the input nodes of the configuration logic 254 instead of ID nodes 264; ID nodes 268 (e.g., output nodes of the increment logic 246) can be connected to the input nodes of the configuration logic 256 instead of ID nodes 266; and output nodes of the increment logic 248 can be connected to the input nodes of the configuration logic 258 instead of ID nodes 268. If the increment logic 244-248 each is an adder, the ID nodes 264 can each be brought to a high voltage (e.g., logical "1") by the base chip 102 such that the increment logic 244 outputs "00" on the ID nodes 266 to the configuration logic 254 and the increment logic 246 (e.g., an overflow bit is disregarded). The increment logic 246 then outputs "01" on the ID nodes 268 to the configuration logic 256 and the increment logic 248, and the increment logic 248 outputs "10" on to the configuration logic 258.

The configuration logic 254, 256, 258 further has one or more input nodes connected to a communication channel 282. The communication channel 282 can be connected through and/or include passive connections of the Z-interfaces 232-238 of the chips 102-108. Data, such as configuration data, can be communicated through the communication channel 282 to each of the configuration logic 254, 256, 258. For example, the processing system 202 (e.g., a PMC of the processing system 202) can transmit data via the programmable network 212 of the NoC 210 to the Z-interface 232, where the data is further communicated to each the configuration logic 254, 256, 258 through the communication channel 282. The data includes a target ID of the targeted fabric chip 104-108. In some examples, the data can be configuration data, which can further include an address within the targeted fabric IC to which state data is to be written and the state data to be written.

The configuration logic 254, 256, 258 includes comparison and enable/disable logic (CEDL) to compare the target ID of the data with the unique ID received on the respective pair of ID nodes 264, 266, 268. In the illustrated example, the configuration logic 254, 256, 258 further includes logic to program a programmable tile or element based on the address and state data of configuration data when the target ID of the configuration data matches the unique ID received on the respective pair of ID nodes 264, 266, 268. The configuration logic 254, 256, 258 can include a configuration Frame (CFRAME) driver that is connected to a configuration interconnect of the PL region 224, 226, 228. The CFRAME driver may be or include control logic to communicate the state data of the configuration data to the configuration interconnect to program the PL region 224, 226, 228 when the target ID of the configuration data matches the unique ID received on the respective pair of ID nodes 264, 266, 268. The CFRAME driver and configuration interconnect can direct the state data of the configuration data to appropriate programmable tiles indicated by the address data of the configuration data, and can control programming such programmable tiles with the state data (e.g., writing the state data to configuration memory, such as configuration random access memory (CRAM)). Logic and connections can be implemented by the PL region 224, 226, 228 by programming any of the programmable tiles of the PL region 224, 226, 228 (e.g., by writing the state data to configuration memory, such as CRAM).

Further, the configuration logic 254, 256, 258 can include control logic as part of the CFRAME driver and/or in addition to the CFRAME driver that is configured to communicate the state data of the configuration data to programmable active circuits of the Z-interface 234, 236, 238 to program those programmable active circuits when the target ID of the configuration data matches the unique ID received on the respective pair of ID nodes 264, 266, 268. The address of the configuration data can indicate whether programmable tile(s) of the PL region and/or programmable active circuits of the Z-interface 234, 236, 238 are to be programmed by the state data of the configuration data.

Each of the configuration logics 254, 256, 258 receives the same data (e.g., same configuration data) through the communication channel 282. The one of the configuration logics 254, 256, 258 that receives the unique ID received on the respective pair of ID nodes 264, 266, 268 that matches the target ID of the data (e.g., configuration data) is enabled to program tile(s) or element(s) as described above, while the others of the configuration logics 254, 256, 258 are disabled from programming any tile or element.

Figure 3:
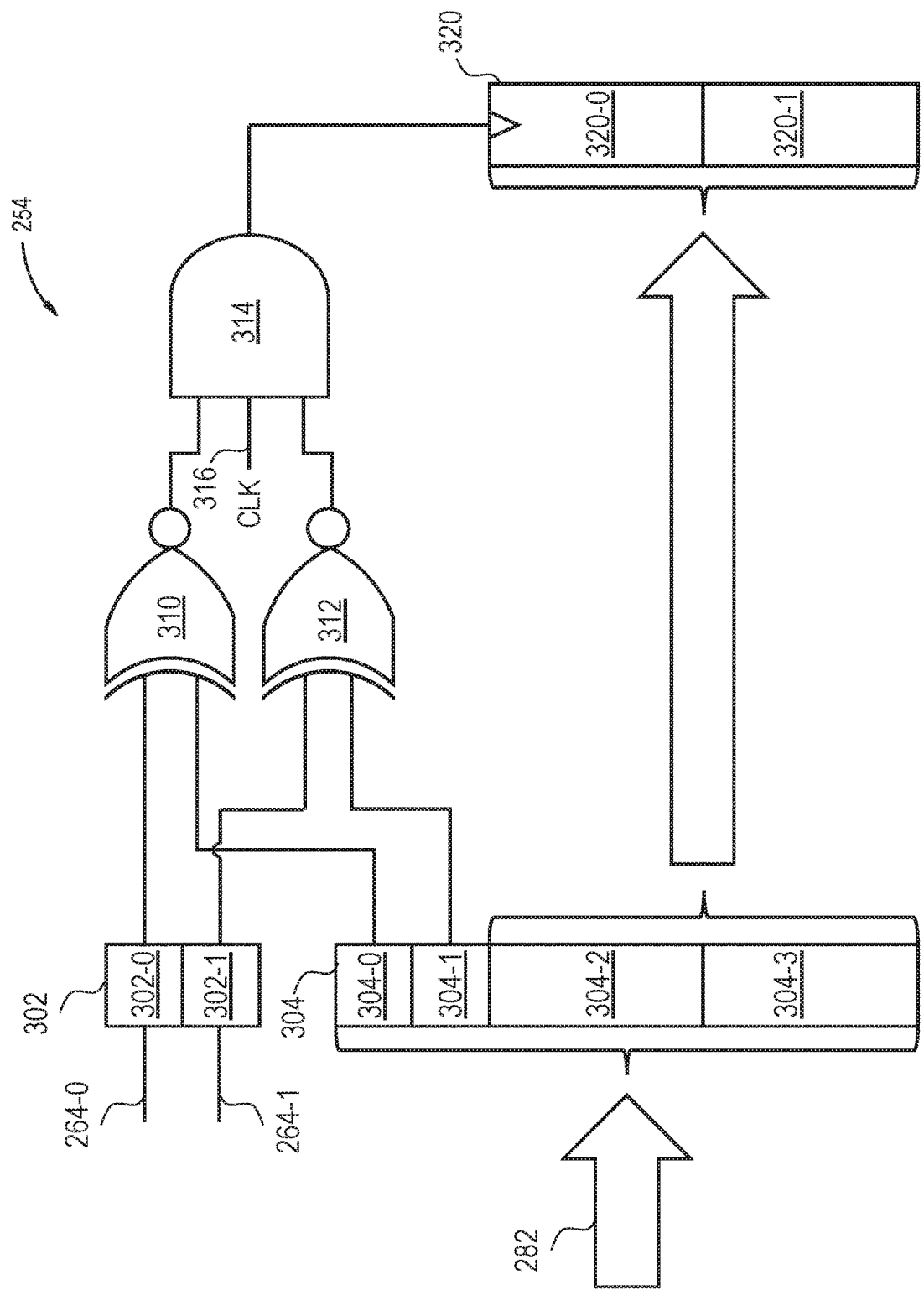
FIG. 3 is a circuit schematic of at least a portion of configuration logic according to some examples.

FIG. 3 illustrates a circuit schematic of at least a portion of configuration logic 254 according to some examples. Each of the configuration logics 254, 256, 258 can include the circuit schematic as illustrated in and described with respect to FIG. 3 The circuit schematic of FIG. 3 is to illustrate an example CEDL that is configured to compare a target ID of data with a unique ID of the respective fabric chip, and to enable/disable other control logic within the respective configuration logic for programming tile(s) or element(s) within the respective fabric IC. A person having ordinary skill in the art will readily understand modifications that can be made, as wells as different circuits that can achieve similar or the same functionality.

The configuration logic 254 includes a fabric ID register 302, an input data register 304, CEDL, and an intermediate data register 320. The CEDL in this example includes exclusive NOR (XNOR) gates 310, 312 and an AND gate 314. CEDL can be or include other logic in other examples.

The fabric ID register 302, input data register 304, and intermediate data register 320 each include storage elements, such as flip-flops (e.g., D flip-flops) or latches, for respective bit positions. The fabric ID register 302 includes an ID first bit storage element 302-0 and an ID second bit storage element 302-1. The ID first bit storage element 302-0 has an input node connected to the first ID node 264-0, and the ID second bit storage element 302-1 has an input node connected to the second ID node 264-1. Hence, the fabric ID register 302 is configured to store the unique ID of the fabric chip 104. The ID first bit storage element 302-0 has an output node connected to an input node of the XNOR gate 310, and the ID second bit storage element 302-1 has an output node connected to an input node of the XNOR gate 312. In some examples, the fabric ID register 302 can be omitted, for example, when the ID nodes 264-0, 264-1 are connected to respective input nodes of the XNOR gates 310, 312 and the unique ID of the of the fabric chip 104 persists on the ID nodes 264-0, 264-1. In some examples, including the fabric ID register 302 can permit, for example, power gating the increment logic 244. For example, in a boot sequence of the chip stack, after the increment logics 244, 246, 248 are powered up and stable, which generates the unique IDs of the fabric chips, the processing system 202 (e.g., the PMC of the processing system 202) can toggle respective clock input nodes of the ID bit storage elements 302-0, 302-1 to store and latch the unique ID, and then cause the increment logics 244, 246, 248 to be in a powered down state by power gating.

The input data register 304 includes an ID first bit storage element 304-0, an ID second bit storage element 304-1, address bit storage elements 304-2, and state bit storage elements 304-3. The bit storage elements 304-0, 304-1, 304-2, 304-3 of the input data register 304 have respective input nodes connected to the communication channel 282. The ID bit storage elements 304-0, 304-1 of the input data register 304 are configured to store the target ID of data (e.g., configuration data) received from the communication channel 282. In the illustrate example, the address bit storage elements 304-2 of the input data register 304 are configured to store the address data of configuration data received from the communication channel 282. The state bit storage elements 304-3 of the input data register 304 are configured to store the state data of configuration data received from the communication channel 282. The ID first bit storage element 304-0 has an output node connected to another input node of the XNOR gate 310, and the ID second bit storage element 304-1 has an output node connected to another input node of the XNOR gate 312. The address bit storage elements 304-2 have respective output nodes connected to input nodes of address bit storage elements 320-0 of the intermediate data register 320. The state bit storage elements 304-3 have respective output nodes connected to input nodes of state bit storage elements 320-1 of the intermediate data register 320. A clock input node of the input data register 304 (e.g., respective clock input nodes of the bit storage elements 304-0, 304-1, 304-2, 304-3) can be connected to a clock node of the communication channel 282 to toggle the clock input node(s) to store configuration data in the input data register 304.

Respective output nodes of the XNOR gates 310, 312 are connected to input nodes of the AND gate 314. A clock node 316 (e.g., on which a clock signal (CLK) is provided) is connected to another input node of the AND gate 314. An output node of the AND gate 314 is connected to a clock input node of the intermediate data register 320 (e.g., respective clock input nodes of the bit storage elements 320-0, 320-1).

In operation of the illustrated example, configuration data is written to the input data register 304. The target ID of the configuration data that is stored in the ID bit storage elements 304-0, 304-1 is compared to the unique ID of the fabric chip stored in the ID bit storage elements 302-0, 302-1 by operation of the XNOR gates 310, 312 and AND gate 314. When the unique ID and target ID match, the AND gate 314 outputs an enabled clock signal that is capable of triggering the intermediate data register 320. When the unique ID and target ID do not match, the AND gate 314 outputs a disabled signal that is logically low or "0" that does not toggle while disabled and is not capable of triggering the intermediate data register 320. Hence, when the unique ID and target ID match, address data and state data of the configuration data stored in the input data register 304 (e.g., in the bit storage elements 304-2, 304-3) is passed to and stored in the intermediate data register 320 (e.g., in the bit storage elements 320-0, 320-1). When the unique ID and target ID do not match, address data and state data of the configuration data stored in the input data register 304 (e.g., in the bit storage elements 304-2, 304-3) is prevented from being stored in the intermediate data register 320 (e.g., in the bit storage elements 320-0, 320-1) since the signal at the clock input node of the intermediate data register 320 does not toggle.

The intermediate data register 320 may be part of a control circuit in the configuration logic 254. Output nodes of the intermediate data register 320 can be connected to another control circuit of the configuration logic 254, such as a CFRAME driver. Any address data and state data stored in the intermediate data register 320 is provided to the subsequent control circuit (e.g., CFRAME driver), which is configured to process the address data and state data such that appropriate programmable tile(s) or element(s) are programmed according to the address data and state data. Hence, if the address data and state data are not stored in the intermediate data register 320 (e.g., due to the target ID not matching the unique ID as described above), then such address data and state data are not provided to the subsequent control circuit for programming. Accordingly, the processing system 202 (e.g., the PMC of the processing system 202) on the base chip 102 can communicate configuration data, via the communication channel 282, to each of the fabric chips 104, 106, 108, and the fabric chip targeted by that configuration data by the target ID within the configuration data is programmed according to that configuration data while the other fabric chips are not programmed according to that configuration data.

As stated, the circuit schematic is merely an example. Various modifications can be made. For example, the configuration logic 254 can include a Serializer/Deserializer (SerDes) circuit, for example, when the communication channel 282 is configured to communicate configuration data serially. In such an example, the SerDes circuit can have an input node connected to the communication channel 282, and the input data register 304 can be part of the SerDes circuit or have input nodes connected to output nodes the SerDes circuit. In some examples, one or both of the data registers 304, 320 can be omitted, such as depending on how data is provided to a control circuit of the configuration logic 254, such as timing of the data. In some examples, a disable/enable signal can be provided separate from a clock signal and based on the comparison of the unique IDs. The disable/enable signal can be asserted, e.g., logically high when the target ID matches the unique ID, and can be de-asserted, e.g., logically low when the target ID does not match the unique ID. The disable/enable signal can be supplied to the subsequent control circuit, which disables or enables the control circuit. In some examples, the disable/enable signal can be provided as a mask to configuration data. A person having ordinary skill in the art will readily envision a number of modification that can be made.

The foregoing description has be provided in the context of the unique IDs each being two bits. Two bits for unique IDs permit four (e.g., $2^2$=4) unique IDs for fabric chips. A person having ordinary skill in the art will readily understand that more or fewer bits for unique IDs can permit for more or fewer unique IDs for fabric chips. Generally, N number of bits for unique IDs can permit $2^N$ unique IDs for fabric chips. A person having ordinary skill in the art will readily understand how to extend the above description to N number of bits.

According to some examples, the fabric chips 104-108 (or other chips that are not fabric chips) can have a same hardware layout and can have different unique IDs as described above. This permits different fabric chips to be targeted by configuration data that is used to program the targeted fabric chip. The stacking of the chips and the connections between the chips naturally result in unique IDs being generated for each of the fabric chips. The same hardware layout of the fabric chips can permit a single tape-out of the fabric chips, which reduces costs. Additionally, a number of different size products (e.g., different number of fabric chips in a chip stack) can be implemented with using any number of the fabric chips with the same hardware layout. The generation of the unique IDs as described herein can be based on non-volatile connectivity, and can obviate using eFuses or other non-volatile memory to store unique IDs of the fabric chips and using other programming mechanisms (e.g., by a PMC through the NPI) to program unique IDs of the fabric chips.

Figure 4:
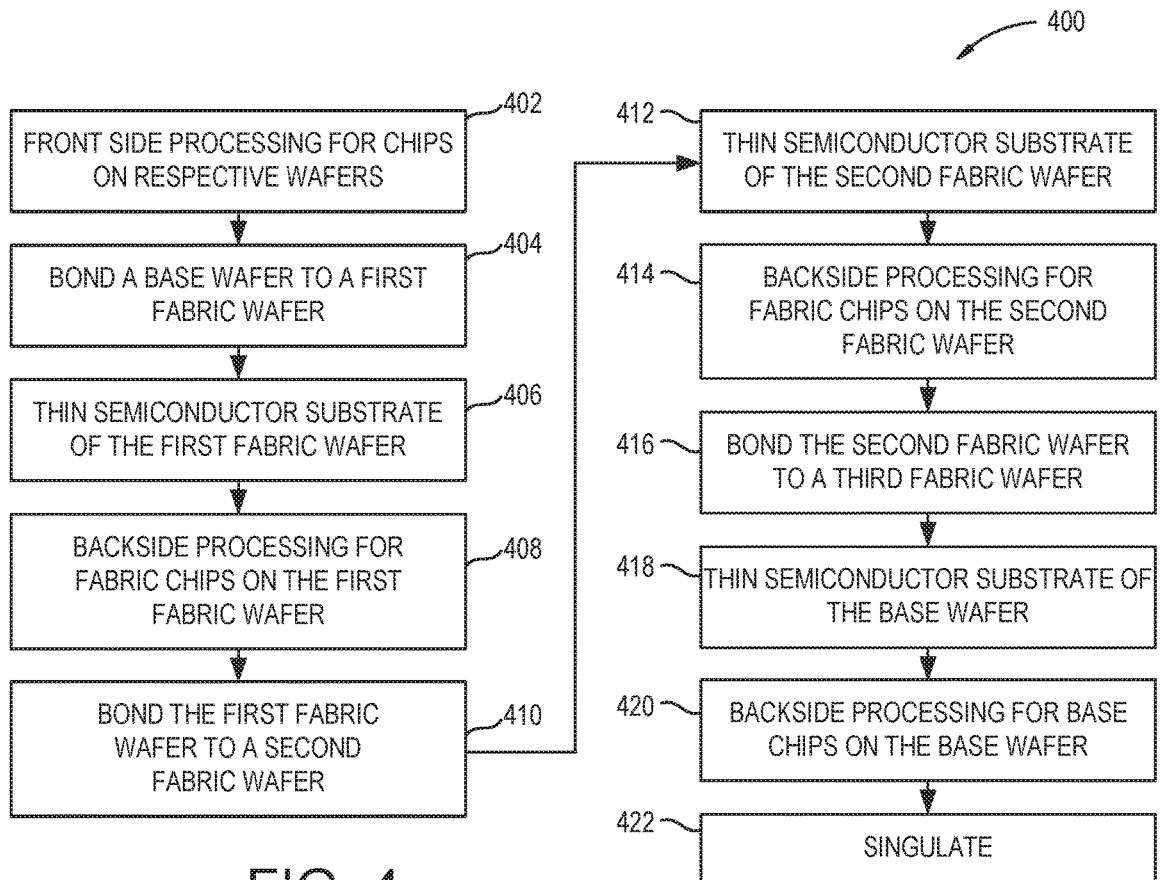
FIG. 4 is a flowchart of a method of forming the multi-chip device of FIGS. 1 and 2 according to some examples.

FIG. 4 is a flowchart of a method 400 of forming the multi-chip device of FIGS. 1 and 2 according to some examples. A person having ordinary skill in the art will readily understand modifications to achieve other multi-chip devices. The processing of the method 400 of FIG. 4 is generally described, and a person having ordinary skill in the art will readily understand the more specific processing that can be performed. The more specific processing can be according to any semiconductor processing for forming an IC on substrate, which is to be singulated into a chip. For ease of description herein, a wafer on which one or more base chips 102 are formed is referred to as a base wafer, and a wafer on which one or more fabric chips 104, 106, 108 are formed is referred to as a fabric wafer. Any wafer can be any shape and/or size.

At block 402, front side processing for chips on the respective wafers is performed. For example, front side processing of each semiconductor substrate 112, 114, 116, 118 (e.g., wafer) can include forming devices (e.g., transistors 142, 144, 146, 148) in and/or on the front surface of the semiconductor substrate 112, 114, 116, 118, and forming front side dielectric layer(s) 122, 124, 126, 128 with metallizations and front side bond pads 152, 154, 156, 158 on the front surface of the semiconductor substrate 112, 114, 116, 118. Multiple base chips 102 can be formed on a base wafer. Multiple fabric chips 104, 106, or 108 can be formed on each of a plurality of fabric wafers. The front side processing can, for example, form portions of the Z-interfaces that are on and/or in the respective semiconductor substrate and front side dielectric layer(s).

At block 404, a base wafer is bonded to a first fabric wafer, such as front side to front side bonding as shown in FIG. 1. As a result of the bonding, a front side of a base chip 102 is bonded to a front side of a fabric chip 104, as shown in FIG. 1. The bonding can be hybrid bonding, such as bonding front side bond pads 152 on the base wafer to front side bond pads 154 on the first fabric wafer, and bonding the exterior surface of the front side dielectric layer(s) 122 on the base wafer to the exterior surface of the front side dielectric layer(s) 124 on the first fabric wafer.

At block 406, the semiconductor substrate of the first fabric wafer is thinned from a backside of the first fabric wafer. As show in FIG. 1, the semiconductor substrate 114 of the fabric chip 104 is thinned from the backside. The thinning can be by a chemical mechanical polish (CMP) or other appropriate process. At block 408, backside processing for fabric chips on the first fabric wafer is performed. As illustrated by FIG. 1, the backside processing can include forming backside TSVs 164 through the semiconductor substrate 114 of the first fabric wafer and connecting to metallization in the front side dielectric layer(s) 124 on the first fabric wafer. The backside processing can further include forming backside dielectric layer(s) 134 with metallizations and backside bond pads 174 on the backside of the semiconductor substrate 114. The metallizations in the backside dielectric layer(s) 134 can be connected to the metallizations in the front side dielectric layer(s) 124 through the backside TSVs 164. Generally, the formation of backside TSVs and metallizations in the backside dielectric layer(s) can form at least portions of Z-interfaces (e.g., pass-through interfaces and/or with connections to active circuits in and/or on the semiconductor substrate) that are on and/or in the respective semiconductor substrate and backside dielectric layer(s).

At block 410, the first fabric wafer is bonded to a second fabric wafer, such as backside to front side bonding as shown in FIG. 1. As a result of the bonding, a backside of a fabric chip 104 is bonded to a front side of a fabric chip 106, as shown in FIG. 1. The bonding can be hybrid bonding, such as bonding backside bond pads 174 on the first fabric wafer to front side bond pads 156 on the second fabric wafer, and bonding the exterior surface of the backside dielectric layer(s) 134 on the first fabric wafer to the exterior surface of the front side dielectric layer(s) 126 on the second fabric wafer.

At block 412, the semiconductor substrate of the second fabric wafer is thinned from a backside of the second fabric wafer, like described with respect to block 406. As show in FIG. 1, the semiconductor substrate 116 of the fabric chip 106 is thinned from the backside.

At block 414, backside processing for fabric chips on the second fabric wafer is performed, like described with respect to block 408. As illustrated by FIG. 1, the backside processing can include forming backside TSVs 166 through the semiconductor substrate 116 of the second fabric wafer and connecting to metallization in the front side dielectric layer(s) 126 on the second fabric wafer. The backside processing can further include forming backside dielectric layer(s) 136 with metallizations and backside bond pads 176 on the backside of the semiconductor substrate 116. The metallizations in the backside dielectric layer(s) 136 can be connected to the metallizations in the front side dielectric layer(s) 126 through the backside TSVs 166.

At block 416, the second fabric wafer is bonded to a third fabric wafer, such as backside to front side bonding as shown in FIG. 1. As a result of the bonding, a backside of a fabric chip 106 is bonded to a front side of a fabric chip 108, as shown in FIG. 1. The bonding can be hybrid bonding, such as bonding backside bond pads 176 on the second fabric wafer to front side bond pads 158 on the third fabric wafer, and bonding the exterior surface of the backside dielectric layer(s) 136 on the second fabric wafer to the exterior surface of the front side dielectric layer(s) 128 on the third fabric wafer.

At block 418, the semiconductor substrate of the base wafer is thinned from a backside of the base wafer, like described with respect to block 406. As show in FIG. 1, the semiconductor substrate 112 of the base chip 102 is thinned from the backside.

At block 420, backside processing for base chips on the base wafer is performed, like described with respect to block 408. As illustrated by FIG. 1, the backside processing can include forming backside TSVs 162 through the semiconductor substrate 112 of the base wafer and connecting to metallization in the front side dielectric layer(s) 122 on the base wafer. The backside processing can further include forming backside dielectric layer(s) 132 with metallizations and exterior connector backside pads 172 on the backside of the semiconductor substrate 112. The metallizations in the backside dielectric layer(s) 132 can be connected to the metallizations in the front side dielectric layer(s) 122 through the backside TSVs 162. The backside processing for the base chips 102 can further include forming the passivation layer 180 and external connectors 182. At block 422, the bonded wafers are singulated (e.g., by sawing) to separate individual multi-chip devices that have been formed. Each of the multi-chip devices can be as shown in FIG. 1.

The various operations of blocks of the method 400 can be repeated and/or omitted to form various multi-chip devices. The method 400 has been provided as an example of how some multi-chip devices can be formed. In other examples, some operations can be performed in parallel. For example, multiple different wafer stacks can be formed (e.g., by bonding and processing respective wafers) in parallel before the multiple different wafer stacks are then bonded together and further processed to form the multi-chip devices. A person having ordinary skill in the art will readily understand how to form other multi-chip devices based on the description of the method 400 above.

Figure 5:
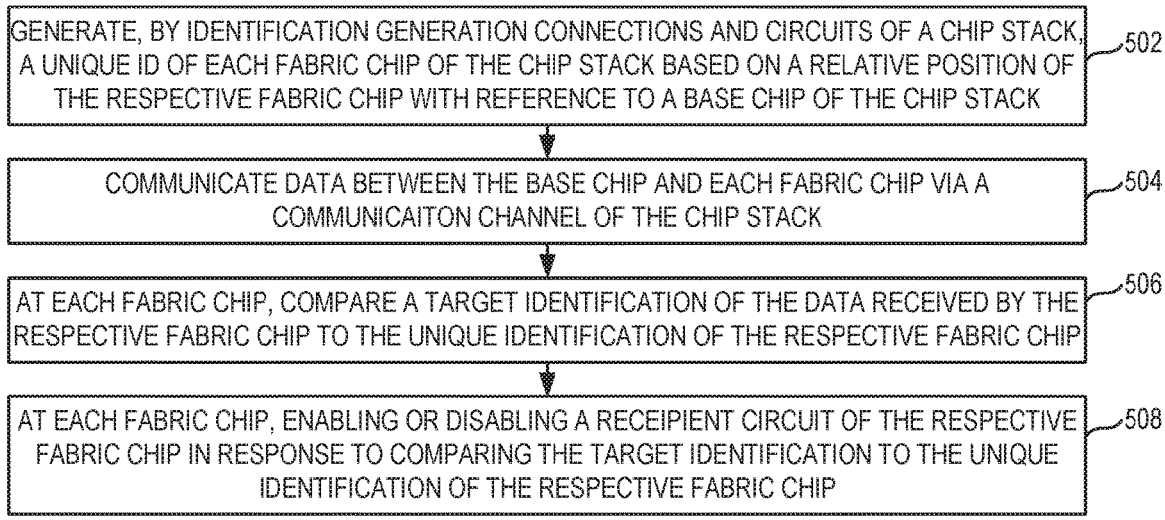
FIG. 5 is a flowchart of a method of operating a multi-chip device according to some examples.

FIG. 5 is a flowchart of a method 500 of operating a multi-chip device according to some examples. The multi-chip device can be as shown in FIGS. 1 and 2, for example. Various operations of the method 500 are described, for illustrative purposes, in the context of the configuration logic of FIG. 3. A person having ordinary skill in the art will readily understand that such operations can be similarly performed or replicated on other multi-chip devices.

At block 502, a unique ID of each fabric chip of a chip stack is generated, by identification generation connections and circuits of the chip stack, based on a relative position of the respective fabric chip with reference to a base chip of the chip stack. As described previously, connections of the increment logic 244-248 between each other and with the base chip 102 generate unique IDs for the fabric chips 104-108.

At block 504, data is communicated between the base chip and each fabric chip via a communication channel of the chip stack. As described previously, data (e.g., communication data) can be communicated from the base chip 102 via the communication channel 282 to the fabric chips 104-108.

At block 506, at each fabric chip, a target identification of the data received by the respective fabric chip is compared to the unique identification of the respective fabric chip. The comparison is performed by CEDL of the respective fabric chip. As described above, CEDL of configuration logic 254-258 compares the target ID of data received from the communication channel 282 to the unique ID of the respective fabric chip 104-108.

At block 508, at each fabric chip, a recipient circuit of the respective fabric chip is enabled or disabled in response to comparing the target identification to the unique identification of the respective fabric chip. As an example and as described above, configuration logic 254-258, which includes the respective CEDL, can further include a control circuit configured to program a programmable tile or element of the respective fabric chip 104-108, such as a programmable tile of a programmable logic region and/or a programmable active circuit of a Z-interface. The control circuit of the respective fabric chip 104-108 can be enabled when the target identification matches the unique identification of the respective fabric chip, and can, when enabled, program a programmable tile or element, such as a programmable tile of a programmable logic region, based on address data and state data of the data. The control circuit of the respective fabric chip 104-108 can be disabled when the target identification does not match the unique identification of the respective fabric chip.

While the foregoing is directed to specific examples, other and further examples may be devised without departing from the basic scope thereof, and the scope thereof is determined by the claims that follow.

What is claimed is:

1. A multi-chip device comprising:
   a chip stack comprising:
      a base chip; and
      two or more overlying chips overlying the base chip;
   wherein:
      neighboring chips of the chip stack are connected to each other;
      the chip stack includes identification generation connections and circuits configured to generate a unique identification of each chip of the two or more overlying chips based on a relative position of the respective overlying chip with reference to the base chip;
      the chip stack includes a communication channel from the base chip to each chip of the two or more overlying chips; and
      each chip of the two or more overlying chips includes comparison and enable/disable logic (CEDL) communicatively coupled to the communication channel, the CEDL being configured to compare a target identification of data received by the respective overlying chip to the unique identification of the respective overlying chip and responsively enable or disable a recipient circuit of the respective overlying chip.

2. The multi-chip device of claim 1, wherein each chip of the two or more overlying chips includes increment logic, the identification generation connections and circuits including the increment logic of the two or more overlying chips.

3. The multi-chip device of claim 2, wherein:
the increment logic of one of the two or more overlying chips that is immediately overlying the base chip has an input node connected to a ground node of the base chip;
the increment logic of each subsequently overlying one of the two or more overlying chips has an input node connected to an output node of the increment logic of an immediately underlying one of the two or more overlying chips; and
for each chip of the two or more overlying chips, the input node of the increment logic of the respective overlying chip is connected to an input node of the CEDL of the respective overlying chip.

4. The multi-chip device of claim 3, wherein for each chip of the two or more overlying chips, the increment logic includes an adder.

5. The multi-chip device of claim 3, wherein for each chip of the two or more overlying chips, the increment logic and the CEDL each has two or more bit input nodes, the two or more bit input nodes of the increment logic of the one of the two or more overlying chips that is immediately overlying the base chip being connected to the ground node of the base chip.

6. The multi-chip device of claim 1, wherein each chip of the two or more overlying chips includes configuration logic, the configuration logic including the CEDL and control logic, the control logic being the recipient circuit, the control logic being configured to be enabled and program a programmable tile or element based on address data and state data of the data when the target identification of the data matches the unique identification of the respective overlying chip, the control logic being configured to be disabled when the target identification of the data does not match the unique identification of the respective overlying chip.

7. The multi-chip device of claim 6, wherein each chip of the two or more overlying chips includes a programmable logic region, the control logic being configured to be enabled and program one or more programmable tiles of the programmable logic region based on the address data and the state data of the data when the target identification of the data matches the unique identification of the respective overlying chip.

8. The multi-chip device of claim 1, wherein each chip of the two or more overlying chips has a same hardware layout.

9. A method of operating a multi-chip device, the method comprising:
generating, by identification generation connections and circuits of a chip stack, a unique identification of each chip of two or more overlying chips of the chip stack based on a relative position of the respective overlying chip with reference to a base chip of the chip stack, the two or more overlying chips overlying the base chip in the chip stack, neighboring chips of the chip stack being connected to each other;
communicating data between the base chip and each chip of the two or more overlying chips via a communication channel; and comparing, at each chip of the two or more overlying chips, a target identification of the data received by the respective overlying chip to the unique identification of the respective overlying chip, the comparison being by comparison and enable/disable logic (CEDL) of the respective overlying chip, the CEDL being communicatively coupled to the communication channel; and
enabling or disabling, at each chip of the two or more overlying chips, a recipient circuit of the respective overlying chip in response to comparing the target identification to the unique identification of the respective overlying chip.

10. The method of claim 9, wherein generating, by the identification generation connections and circuits, the unique identification of each chip of the two or more overlying chips includes:
providing a first value by a connection to the base chip to one of the two or more overlying chips that is immediately overlying the base chip; and
incrementing a received value at each chip of the two or more overlying chips to generate an incremented value, the received value being the first value or the incremented value of a chip immediately underlying the respective overlying chip.

11. The method of claim 10, wherein for each chip of the two or more overlying chips, the received value is the unique identification of the respective overlying chip.

12. The method of claim 10, wherein the first value is provided by a connection to a ground node of the base chip.

13. The method of claim 10, wherein the received value of each chip of the two or more overlying chips is two or more bits.

14. The method of claim 9, wherein:
each chip of the two or more overlying chips includes configuration logic, the configuration logic including the CEDL and control logic, the control logic being the recipient circuit;
enabling or disabling, at each chip of the two or more overlying chips, includes:
enabling the control logic when the target identification of the data matches the unique identification of the respective overlying chip; and
programming a programmable tile or element based on address data and state data of the data when the control logic is enabled; and
disabling the control logic when the target identification of the data does not match the unique identification of the respective overlying chip.

15. The method of claim 14, wherein each chip of the two or more overlying chips includes a programmable logic region, programming the programmable tile or element when the control logic is enabled includes programming one or more programmable tiles of the programmable logic region based on the address data and the state data of the data when the control logic is enabled.

16. The method of claim 9, wherein each chip of the two or more overlying chips has a same hardware layout.

17. A multi-chip device comprising:
a chip stack comprising a base chip and fabric chips overlying the base chip; wherein:
neighboring chips of the chip stack are connected to each other;
each chip of the fabric chips includes increment logic, configuration logic, and a programmable logic region;

the increment logic of one of the fabric chips immediately overlying the base chip has input nodes connected to a ground node of the base chip;

the increment logic of each subsequently overlying one of the fabric chips has input nodes connected to output nodes of the increment logic of an immediately underlying one of the fabric chips;

for each chip of the fabric chips, the input nodes of the increment logic of the respective fabric chip is connected to respective input nodes of the configuration logic of the respective fabric chip, the configuration logic being configured to receive a unique identification on the input nodes of the configuration logic;

the chip stack includes a communication channel from the base chip to each chip of the fabric chips; and for each chip of the fabric chips, the configuration logic is configured to compare a target identification of configuration data received by the configuration logic from the communication channel to the unique identification received by the configuration logic, to program a programmable tile of the programmable logic region based on address data and state data of the configuration data when the target identification matches the unique identification, and to not program any programmable element when the target identification does not match the unique identification.

18. The multi-chip device of claim 17, wherein for each chip of the fabric chips, the increment logic includes an adder.

19. The multi-chip device of claim 17, wherein for each chip of the fabric chips, the unique identification is two or more bits.

20. The multi-chip device of claim 17, wherein each chip of the fabric chips has a same hardware layout.

* * * * *